(12) United States Patent
Tsai

(10) Patent No.: US 8,751,178 B2
(45) Date of Patent: Jun. 10, 2014

(54) METHOD AND APPARATUS FOR DETERMINING DISPOSITION OF VIA HOLE ON PRINTED CIRCUIT BOARD

(75) Inventor: Ming-Chin Tsai, Hsinchu (TW)

(73) Assignee: King Yuan Electronics Co., Ltd., Hsinchu (TW)

( * ) Notice: Subject to any disclaimer, the term of this patent is extended or adjusted under 35 U.S.C. 154(b) by 326 days.

(21) Appl. No.: 13/233,121

(22) Filed: Sep. 15, 2011

(65) Prior Publication Data

US 2012/0041710 A1 Feb. 16, 2012

Related U.S. Application Data

(63) Continuation-in-part of application No. 12/329,730, filed on Dec. 8, 2008, now abandoned.

(30) Foreign Application Priority Data

Jul. 31, 2008 (TW) .............................. 97128929 A

(51) Int. Cl.
*G01N 37/00* (2006.01)

(52) U.S. Cl.
USPC .............. 702/81; 702/117; 702/150; 702/155

(58) Field of Classification Search
USPC .......... 716/111, 118, 126, 137; 702/117, 150, 702/155; 361/760, 777, 780, 792–794; 174/250, 255, 256, 260–261
See application file for complete search history.

(56) References Cited

U.S. PATENT DOCUMENTS

| | | | | |
|---|---|---|---|---|
| 5,635,671 A | * | 6/1997 | Freyman et al. | 174/527 |
| 5,761,801 A | * | 6/1998 | Gebhardt et al. | 29/846 |
| 5,764,485 A | * | 6/1998 | Lebaschi | 361/774 |
| 7,124,390 B2 | * | 10/2006 | Smith et al. | 716/120 |

\* cited by examiner

*Primary Examiner* — Elias Desta
(74) *Attorney, Agent, or Firm* — Bacon & Thomas, PLLC

(57) ABSTRACT

A method for determining disposition of via hole on printed circuit board (PCB) includes the steps of: providing a PCB on which is disposed with a geometric layout and a via hole; providing a line on the PCB for intersecting the geometric layout to form a plurality of points of intersection; defining line segments by segmenting the line at each of the points of intersection to form a plurality of line segments; deleting some of the line segments having one end not being point of intersection for the geometric layout to form a plurality of segmented regions; searching a closed region by repeatedly searching region from any one of the points in the plurality of segmented regions; determining whether a closed region is a smallest closed region; determining whether a via hole is located within the smallest closed region.

22 Claims, 12 Drawing Sheets

METHOD AND APPARATUS FOR DETERMINING DISPOSITION OF VIA HOLE ON PRINTED CIRCUIT BOARD

CROSS-REFERENCE TO RELATED APPLICATION

This application is a continuation-in-part (CIP) of U.S. patent application for "Method for disposing power/ground plane of PCB", U.S. application Ser. No. 12/329,730, filed on Dec. 8, 2008.

BACKGROUND OF THE INVENTION

1. Field of the Invention

The present invention is related to a method for disposing power planes and ground planes of printed circuit board, and more particularly, to a method of first segmenting the geometric layout into smallest closed region and then determining whether via hole on the printed circuit board is located in the smallest closed region.

2. Description of Related Art

Generally speaking, printed circuit boards are provided for electric components fixation and mechanical support, and for forming electric connection between electric components at the same time. Printed circuit boards are composed of insulation layer and conduction layer. The insulation layer is usually dielectric material that provides electric insulation between conduction layers. The conduction layer is patterned to form wiring to be used in the electric connection between electric components on the circuit board.

In order to increase the function of printed circuit board, multi-layer board is widely used to form a printed circuit board in order to facilitate the design and layout of circuit and electrical property. For example, the first layer of multi-layer printed circuit board is designed as layout region of the first power plane (such as: 3V DC); the second layer of multi-layer printed circuit board is designed as layout region of ground plane of the whole printed circuit board; and the third layer of multi-layer printed circuit board is designed as layout region of the second power plane (such as: 5V DC). When the three layers are assembled and processed with appropriate hole drilling and electroplating, a multi-layer printed circuit board with different power disposition is completed. Although it is easy to manufacture this kind of printed circuit board, yet the manufacturing process is too complex and the thickness and also production cost of multi-layer printed circuit board cannot be effectively reduced.

With the trend of light, thin, short, and small and the multi-function integrated development of electric products, 3C products for example, the printed circuit board also needs to provide different power supplies to different circuits within the smallest and the thinnest area. Therefore, single-layer printed circuit board is used in many products to meet the demand of providing power supply to different circuits. However, in the stage of designing single-layer printed circuit board, the printed circuit board will be segmented into a plurality of power planes with different voltages (for example: 3V plane, 5V plane) and ground planes. At this moment, it is needed in particular to check whether the via hole is located within the correct power plane (or ground plane) to avoid uncertainty when testing. For example, whether each via hole in 3V plane is connected to power supply of 3V and no via hole is connected to power supply of 5V, and vice versa.

When the layout on the printed circuit board becomes more and more concentrated, the via holes also become smaller and increase in number, and the manually performed checking process that checks one via hole after another is no longer cost-effective, and the yield generated cannot be ensured either.

After conducting thorough search and analysis, it is found that most of the prior arts emphasize on how to automatically segment the printed circuit board for forming a plurality of power planes (or ground planes), such as U.S. Pat. No. 7,124,390. What is emphasized in the present invention is a method for automatically checking via holes in power planes (or ground planes).

SUMMARY OF THE INVENTION

In view of the prior art and some benefit-oriented demands of the industry, one objective of the present invention is to provide a method for determining whether via hole on the printed circuit board is located in the power plane (or ground plane) or not to avoid waste of time in man-operated checking and prevent unavoidable human errors from occurring.

Another objective of the present invention is to provide a method for automatically checking whether via hole on the printed circuit board is located in the power plane (or ground plane) or not through an electronic data processing apparatus, the method of which ensures that the same type of via holes are located in the same power plane (or ground plane) to enhance the accuracy of testing and reduce occurrence of exception in testing.

According to above objectives, the present invention first provides a method for determining whether via hole on the printed circuit board is located within the geometric layout through an electronic data processing apparatus, the method including: providing a printed circuit board on which is disposed with geometric layout and via hole; providing at least a line on said printed circuit board, each of said line having two ends and intersecting said geometric layout to form a plurality of points of intersection; defining line segments by segmenting each line at each point of intersection to form a plurality of line segments; deleting some of said line segments having one end not being point of intersection for the geometric layout to form a plurality of segmented regions; searching closed region by repeatedly searching region formed by any one of the points in said plurality of segmented regions moving toward a neighboring point and returning to the starting point; determining a closed region as the smallest closed region when the closed region is found not to contain another closed region; determining whether a via hole is located within said smallest closed region according to the sum of directed angles formed by said via hole and points of said smallest closed region, determining said via hole as located within said smallest closed region when the sum of directed angles is $2\pi$, determining said via hole as located outside the smallest closed region when the sum of directed angles is 0.

Moreover, the present invention further provides another determination, determining whether another via hole is located between the geometric layout and edge of the printed circuit board. Therefore, a remaining closed region needs to be formed by deducting the aforementioned plurality of segmented regions from edge of printed circuit board; the remaining closed region includes edge of printed circuit board and region formed by points of the plurality of segmented regions. Meantime, the determination of whether another via hole is located in the remaining closed region or not is made according to the sum of directed angles formed by another via hole and edge and points of the remaining closed region. When the sum of directed angles is $2\pi$, another via hole is determined to be within the remaining closed region, and when the sum of directed angles is 0, another via hole is determined to be located outside the remaining closed region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In order to disclose the skills applied in, the objectives of, and the effects achieved by the present invention in a more complete and clearer manner, preferred embodiments are herein described in detail below with related drawings disclosed for reference.

Figure 1A:
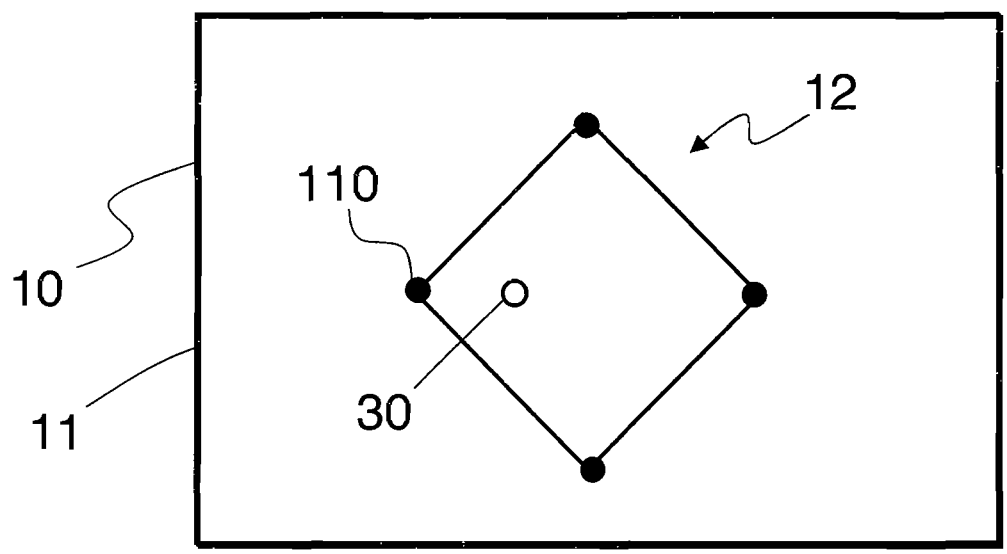
FIG. 1A to FIG. 1E are views of an embodiment of the present invention.
Figure 1B:
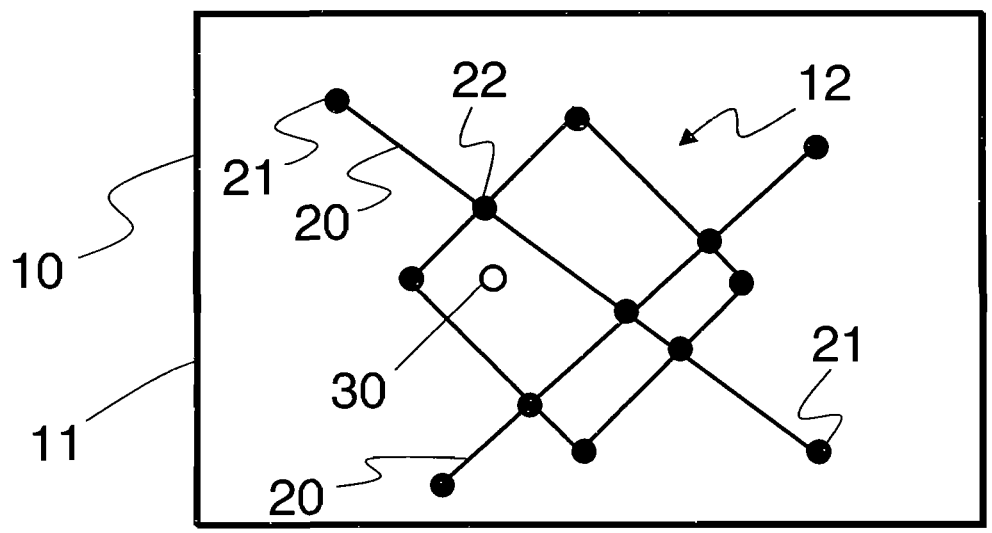
Figure 1C:
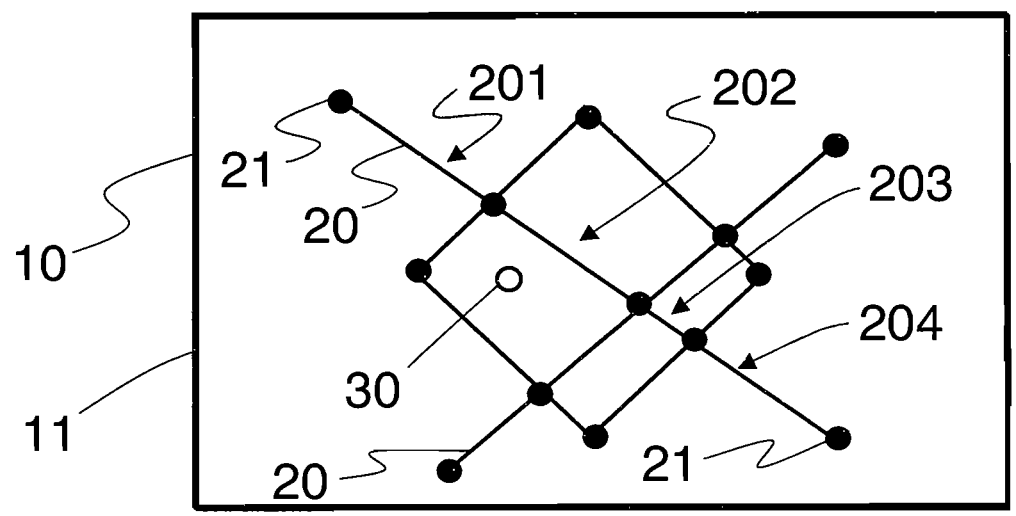
Figure 1D:
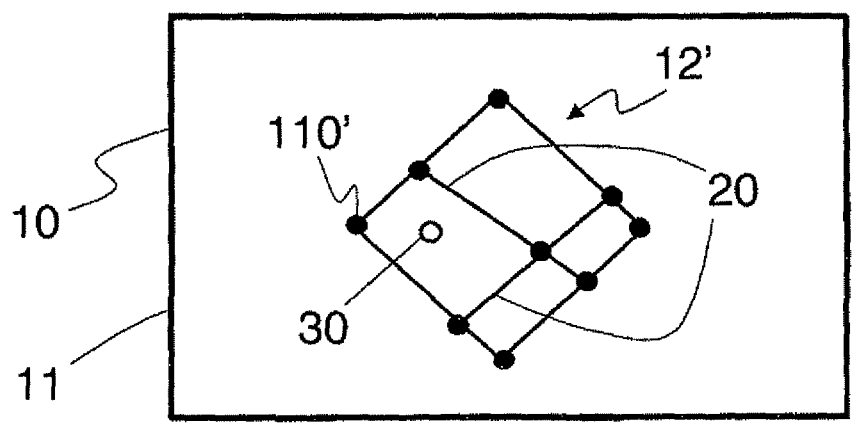
Figure 1E:
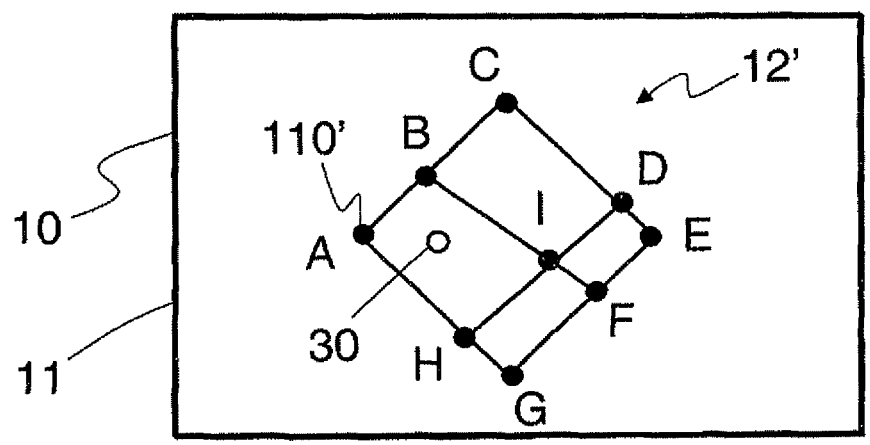

First, referring to FIG. 1A to FIG. 1E, which are views of a method for determining whether via hole on the printed circuit board is located within the geometric layout disclosed by the present invention. Shown in FIG. 1A is a printed circuit board 10 of the present invention which includes an edge 11 and on which is disposed with at least a geometric layout 12 and at least a via hole 30, wherein the geometric layout 12 is formed by connection of a plurality of vertex points 110. First, as shown in FIG. 1B, at least a line 20 is provided on the printed circuit board 10, each of the line 20 having two ends 21 and intersecting the geometric layout 12 to form a plurality of points of intersection 22. Then, as shown in FIG. 1C, each of the line 20 is segmented at each of the points of intersection 22 to form a plurality of line segments 201, 202, 203, and 204. Obviously, among the plurality of line segments 201, 202, 203, and 204, line segment 201 and 204 have one end that is not point of intersection 22, and thus the line segments 201 and 204 are deleted for the geometric layout 12 to form a geometric shape including a plurality of segmented regions. As shown in FIG. 1D and FIG. 1E, the geometric shape 12' including a plurality of segmented regions is formed by connection of a plurality of points 110', which are sequentially marked as A, B, C . . . and I to facilitate the description. In the following, repeatedly searching a region formed by any one of the points 110' in said geometric shape 12' traveling toward a neighboring point 110' and then returning to the same point 110', for example, if the starting point is point A, then region formed with loop A-B-C-D-E-F-G-H-A, loop A-B-I-H-A, loop A-B-A, loop A-B-C-B-A, loop A-B-C-D-I-B-A, loop A-H-I-B-A, etc. will be found. Obviously, region formed by loop A-B-A or by A-B-C-B-A is a line, and loop A-B-C-D-I-B-A includes a repeated line AB; therefore the loops described above are all excluded from being closed region (i.e. the region formed by loop A-B-A or by A-B-C-B-A is a non-closed region). In addition, when loop A-B-I-H-A and loop A-H-I-B-A are found, they will be determined as the same closed region. Therefore, if the starting point is point A, closed regions A-B-I-H-A, A-B-I-F-G-H-A, and A-B-C-D-E-F-G-H-A will be found; if the starting point is point B, closed regions B-C-D-I-B, B-I-H-A-B, B-C-D-E-F-I-B, and B-I-F-G-H-A-B will be found, and so on. A plurality of closed regions are then found by repeatedly starting from all points 110' of the geometric shape 12'. Then, determining whether the plurality of closed regions are the smallest closed region, a closed region being the smallest closed region when it does not contain another closed region; therefore, A-B-I-H-A is a smallest closed region and A-B-C-D-I-H-A and A-B-I-F-G-H-A are not smallest closed regions since they contain A-B-I-H-A. Moreover, it is obvious that the smallest closed region A-B-I-H-A found with point A as starting point and the smallest closed region B-I-H-A-B found with point B as starting point are actually the same closed region and should be taken as the same smallest closed region. Therefore, four smallest closed regions can be found in FIG. 1E, i.e. smallest closed regions A-B-I-H-A, B-C-D-I-B, D-E-F-I-D, and F-G-H-I-F. Finally, determining whether the via hole 30 on the printed circuit board 10 is located within the plurality of smallest closed regions, the determination being made according to the sum of directed angles formed by the via hole 30 and the points 110' of said plurality of smallest closed regions.

Figure 2A:
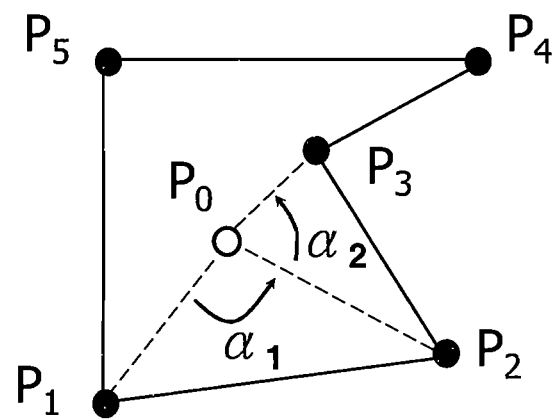
FIG. 2A and FIG. 2B are views of principle for determination of the present invention.
Figure 2B:
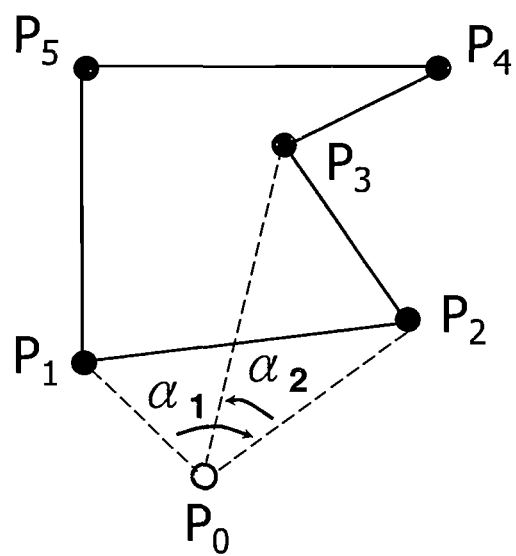

As shown in FIG. 2A and FIG. 2B, which are views of the principle used in the present invention for determining whether via hole $P_0$ is located within the smallest closed region $P_1$-$P_2$-$P_3$-$P_4$-$P_5$-$P_1$ or not. First, via hole $P_0$ and each point $P_i$ ($P_1$, $P_2$, $P_3$, $P_4$, $P_5$) of the smallest closed region are connected to form vector $V_i = P_i - P_0$. Then, directed angle $\alpha_i$ is defined as $P_i P_o P_{i+1}$ and all directed angles $\alpha_i$ ($P_1 P_o P_2$, $P_2 P_o P_3$, $P_3 P_o P_4$, $P_4 P_o P_5$, $P_5 P_o P_1$) formed by the via hole P0 and each $P_i$ (i.e. $P_1$, $P_2$, $P_3$, $P_4$, $P_5$) are summed up. Finally, whether sum of directed angles is $2\pi$ or 0 is determined. When the sum of directed angles is $2\pi$, the via hole is determined to be within the smallest closed region $P_1$-$P_2$-$P_3$-$P_4$-$P_5$-$P_1$ (FIG. 2A); when the sum of directed angles is 0, the via hole is determined to be outside the smallest closed region $P_1$-$P_2$-$P_3$-$P_4$-$P_5$-$P_1$ (FIG. 2B).

Figure 3A:
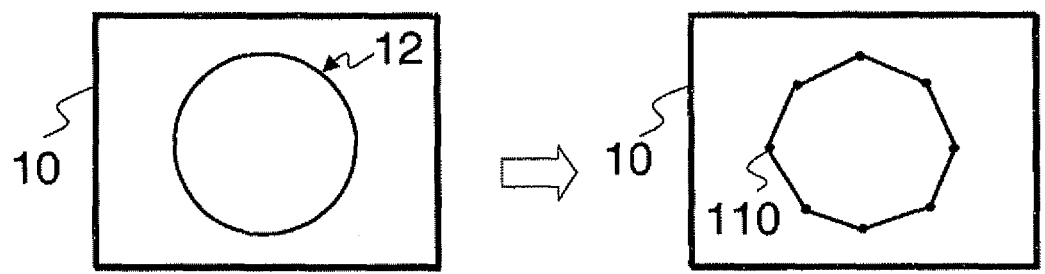
FIG. 3A and FIG. 3B are views of another embodiment of the present invention.
Figure 3B:
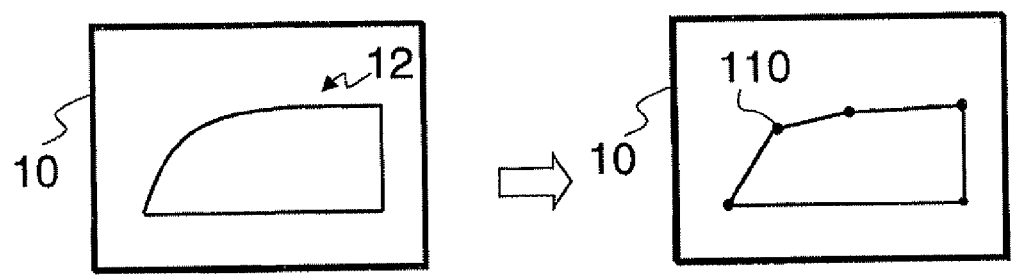

Then, referring to FIG. 3A and FIG. 3B, which are views of another embodiment of the present invention. As shown in FIG. 3A, the printed circuit board 10 is disposed with a geometric layout 12, which is a round geometric shape. Therefore, in the present invention the round geometric layout 12 is first simulated and substituted by geometric shape formed by connection of a plurality of vertex points 110. And as shown in FIG. 3B, the geometric layout 12 on the printed circuit board 10 is formed by curved lines and direct lines. Therefore, in the present invention the geometric layout 12 with curved lines needs to be first simulated and substituted by geometric shape formed by connection of a plurality of vertex points 110. After the aforementioned steps of simulation and substitution are completed, at least a line 20 is provided on the printed circuit board 10 to perform segmenting, searching for closed region and determining the location of via hole in the following.

Figure 4:
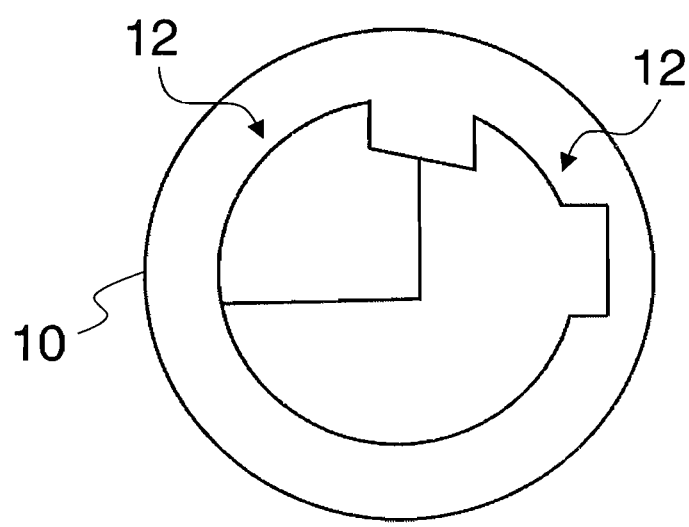
FIG. 4 is still another embodiment of the present invention.

Then, referring to FIG. 4, which is a view of still another embodiment of the present invention. The printed circuit board 10 is a round printed circuit board on which are disposed with two geometric layouts 12, the geometric layouts 12 being formed by curved lines and direct lines. Therefore, the geometric layouts 12 still need to be first simulated and substituted by geometric shape formed by connection of a plurality of vertex points. After the aforementioned step is completed, at least a line 20 is provided on the printed circuit board 10 to perform segmenting, searching for closed region, and determining the location of via hole in the following.

Figure 1F:
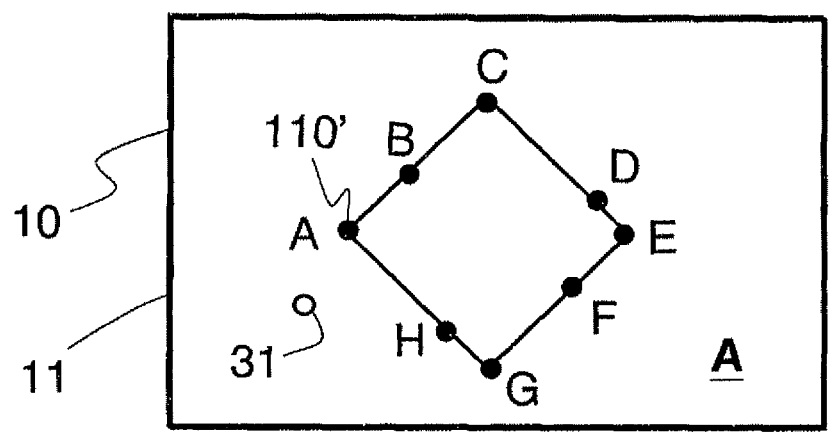
FIG. 1F is a view of the present invention further including another step.

Then, referring to FIG. 1F, which is a view of the present invention further including another step. As shown in FIG. 1F, the printed circuit board 10 includes at least a remaining closed region (A) and at least another via hole 31. The remaining closed region (A) is the region formed by the edge 11 of the printed circuit board 10 in FIG. 1E deducting the geometric shape 12' including a plurality of segmented regions. Therefore, the remaining closed region (A) includes the region formed between the edge 11 of the printed circuit board 10 and the points A, B, C, D, E, F, G, H skirting the geometric shape 12'. In addition, in order to facilitate the determination of whether the other via hole 31 is located within the remaining closed region (A), the edge 11 of the printed circuit board 10 is first simulated and substituted by the geometric shape formed by connection of a plurality of vertex points. Finally, whether the other via hole 31 is located within the remaining closed region (A) is determined, the method of determination being to determine according to the sum of directed angles formed by the other via hole 31 and the vertex points and points A, B, C, D, E, F, and H of the remaining closed region (A). When the sum of directed angles is $2\pi$, the other via hole 31 is determined to be within the remaining closed region (A); when the sum of directed angles is 0, the other via hole 31 is determined to be outside the remaining closed region (A).

Figure 5:
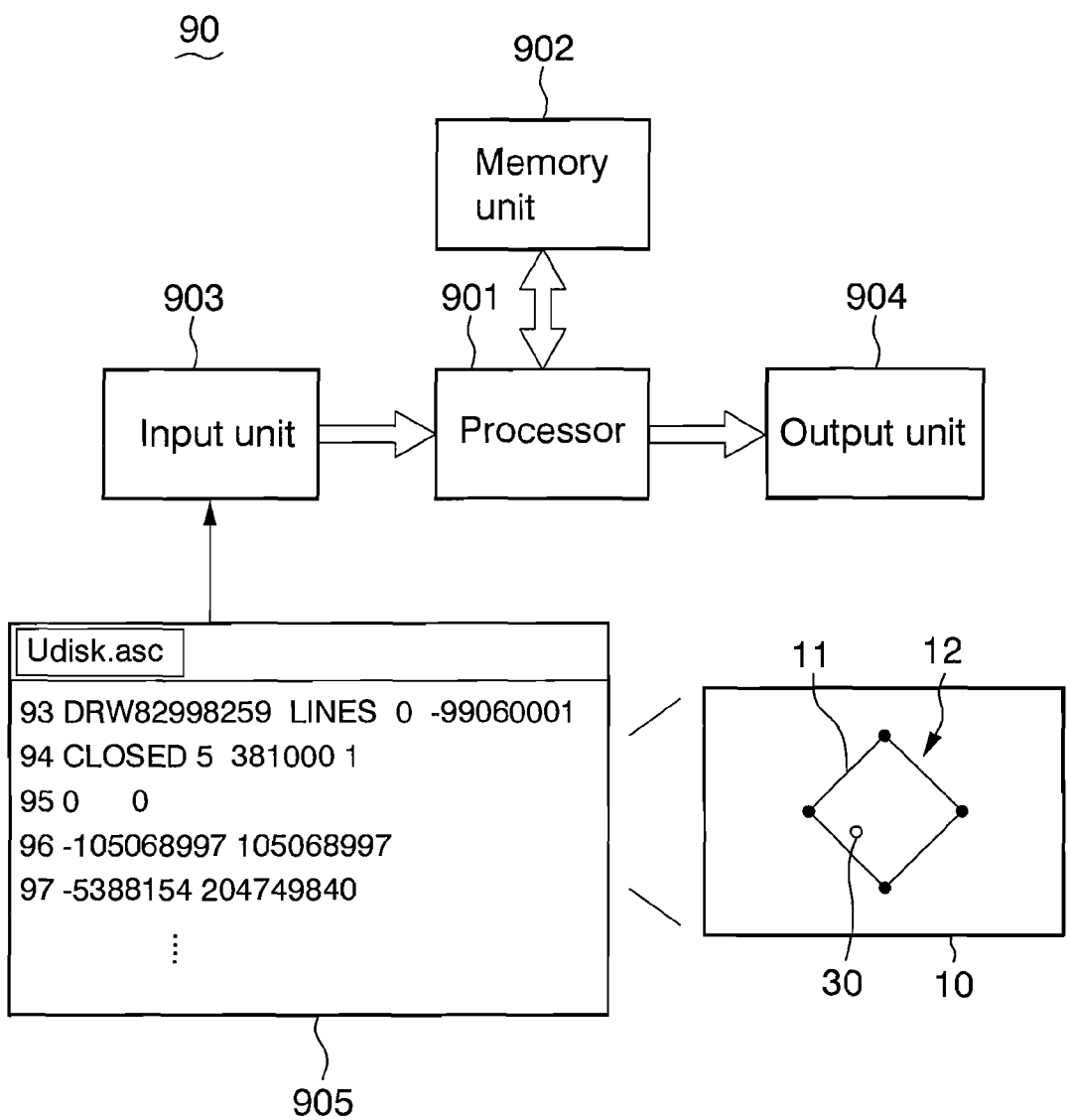
FIG. 5 shown an electronic data processing apparatus in which the present method for determining whether via hole on a printed circuit board is located within a geometric layout is applied.

Furthermore, with reference to FIG. 5, there is shown an electronic data processing apparatus 90 in which the present method for determining whether via hole on a printed circuit board is located within a geometric layout is applied. The electronic data processing apparatus 90 includes a processor 901, a memory unit 902, an input unit 903 and an output unit 904. The processor 901 is coupled to the memory unit 902, the input unit 903 and the output unit 904. The electronic data processing apparatus 90 is preferably implemented on a computer-based platform, such as a personal computer, with specialized hardware or with hardware enabling computer-executable instruction to execute on the computer-based platform.

For executing the present method for determining whether via hole on a printed circuit board is located within a geometric layout in accordance with the invention, a layout file 905, for example a layout description file generated by PADS PCB tool, that represents the printed circuit board 10 with an edge 11 and disposed thereon at least a geometric layout 12 and at least a via hole 30 is inputted into the electronic data processing apparatus 90 via the input unit 903, such as a USB device, a disk drive, a scanner or the like, and the processor 90 executes computer-executable instructions that correspond to the steps of the method and that are accessed from the memory unit 902. After the execution of the method, the processor 90 obtains determination results and provides the determination results via the output unit 904, such as a display monitor, a printer, an external storage device or the like, for user's viewing, printing out or storage as an output file.

As can be appreciated by one skilled in the art, a computer system with an associated computer-readable medium containing instructions for controlling the computer system can be utilized to implement the exemplary embodiments that are disclosed herein. The computer system may include at least one computer such as a microprocessor, digital signal processor, and associated peripheral electronic circuitry.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for determining disposition of via hole on printed circuit board through an electronic data processing apparatus implemented on a computer-based platform having a memory unit, an input unit, an output unit, and a processor coupled to said memory unit, said input unit and said output unit for executing computer-executable instructions that correspond to steps of the method and that are accessed from said memory unit, and obtaining determination results and providing the determination results via the output unit, the method including:

said input unit providing a layout file representative of a printed circuit board, on which is disposed with at least a geometric layout and at least a via hole;

said processor providing at least a line on said printed circuit board, each of said line including two ends and intersecting said geometric layout on said printed circuit board to form a plurality of points of intersection;

said processor defining line segments by segmenting each of said line at each of said points of intersection to form a plurality of line segments;

said processor deleting some of said line segments having one end not being point of intersection for said geometric layout to form a plurality of segmented regions;

said processor searching closed region by repeatedly searching region formed by any one of the points in said plurality of segmented regions moving toward a neighboring point and returning to said same point;

said processor determining smallest closed region, determining a closed region as smallest closed region when said closed region being found not to contain another closed region; and said processor determining whether a via hole is located within said smallest closed region according to sum of directed angles formed by said via hole and points of said smallest closed region.

2. The method according to claim 1, wherein said geometric layout on said printed circuit board is selected from the group consisting of: round geometric shape, direct line, and curved line.

3. The method according to claim 2, wherein said round geometric shape on said printed circuit board is formed by a plurality of lines.

4. The method according to claim 1, wherein area formed by said geometric layout is provided for a single voltage.

5. The method according to claim 1, wherein area formed by said geometric layout is provided as ground plane.

6. The method according to claim 1, wherein while searching for closed region, when number of points of a region formed after searching is smaller than or equals to 3, said region is a non-closed region.

7. The method according to claim 1, wherein while searching for closed region, when a region formed after searching is a line, said region is a non-closed region.

8. The method according to claim 1, wherein while searching for closed region, when a region formed after searching includes a repeated line, said region is a non-closed region.

9. The method according to claim 1, wherein while determining whether said via hole is within said smallest closed region, when sum of directed angles formed by said via hole and points of said smallest closed region is $2\pi$, said via hole is determined to be within said smallest closed region.

10. The method according to claim 1, wherein while determining whether said via hole is within said smallest closed region, when sum of directed angles formed by said via hole and points of said smallest closed region is 0, said via hole is determined to be outside said smallest closed region.

11. A method for determining disposition of via hole on printed circuit board through an electronic data processing apparatus implemented on a computer-based platform having a memory unit, an input unit, an output unit, and a processor coupled to said memory unit, said input unit and said output unit for executing computer-executable instructions that correspond to steps of the method and that are accessed from said memory unit, and obtaining determination results and providing the determination results via said output unit, the method including:
   said input unit providing a layout file representative of a printed circuit board, on which is disposed with an edge and at least a geometric layout and at least a via hole;
   said processor providing at least a line on said printed circuit board, each of said line including two ends and intersecting said geometric layout to form a plurality of points of intersection;
   said processor defining line segments by segmenting each of said line at each of said points of intersection to form a plurality of line segments;
   said processor deleting some of said line segments having one end not being point of intersection for said geometric layout to form a plurality of segmented regions;
   said processor searching closed region by repeatedly searching region formed by any one of the points in said plurality of segmented regions moving toward a neighboring point and returning to said same point;
   said processor determining smallest closed region, determining a closed region as smallest closed region when said closed region being found not to contain another closed region;
   said processor forming a remaining closed region by deducting said plurality of segmented regions from said edge of printed circuit board, said remaining closed region including closed region formed between said edge of printed circuit board and points of said plurality of segmented regions;
   said processor determining whether a via hole is located within said smallest closed region according to sum of directed angles formed by said via hole and points of said smallest closed region; and
   said processor determining whether another via hole is located within said remaining closed region according to sum of directed angles formed by said other via hole and edge and points of said remaining closed region.

12. The method according to claim 11, wherein said geometric layout on said printed circuit board is selected from the group consisting of: round geometric shape, direct line, and curved line.

13. The method according to claim 11, wherein said remaining closed region is provided for a single voltage.

14. The method according to claim 11, wherein said remaining closed region is provided as ground plane.

15. The method according to claim 11, wherein while searching for closed region, when number of points of a region formed after searching is smaller than or equals to 3, said region is a non-closed region.

16. The method according to claim 11, wherein while searching for closed region, when a region formed after searching includes a repeated line, said region is a non-closed region.

17. The method according to claim 11, wherein while determining whether said via hole is within said smallest closed region, when sum of directed angles formed by said via hole and points of said smallest closed region is $2\pi$, said via hole is determined to be within said smallest closed region.

18. The method according to claim 11, wherein while determining whether said via hole is within said smallest closed region, when sum of directed angles formed by said via hole and points of said smallest closed region is 0, said via hole is determined to be outside said smallest closed region.

19. The method according to claim 11, wherein while determining whether said other via hole is within said remaining closed region, when sum of directed angles formed by said other via hole and points of said remaining closed region is $2\pi$, said other via hole is determined to be within said remaining closed region.

20. The method according to claim 11, wherein while determining whether said other via hole is within said remaining closed region, when sum of directed angles formed by said other via hole and points of said remaining closed region is 0, said other via hole is determined to be outside said remaining closed region.

21. An apparatus for determining disposition of via hole on printed circuit board, including:
   an input unit for inputting a layout file representative of a printed circuit board disposed thereon at least a geometric layout and at least a via hole;
   an output unit; and
   a processor that is coupled to the input unit to obtain the printed circuit board and that is coupled to the output unit to provide determination result, the processor configured to perform:
   providing at least a line on said printed circuit board, each of said line including two ends and intersecting said geometric layout on said printed circuit board to form a plurality of points of intersection;
   defining line segments by segmenting each of said line at each of said points of intersection to form a plurality of line segments;
   deleting some of said line segments having one end not being point of intersection for said geometric layout to form a plurality of segmented regions;
   searching closed region by repeatedly searching region formed by any one of the points in said plurality of segmented regions moving toward a neighboring point and returning to said same point;
   determining smallest closed region, determining a closed region as smallest closed region when said closed region being found not to contain another closed region; and
   determining whether a via hole is located within said smallest closed region according to sum of directed angles formed by said via hole and points of said smallest closed region.

22. An apparatus for determining disposition of via hole on printed circuit board, including:
   an input unit for inputting a layout file representative of a printed circuit board with an edge and disposed thereon at least a geometric layout and at least a via hole;
   an output unit; and
   a processor that is coupled to the input unit to obtain the printed circuit board and that is coupled to the output unit to provide determination result, the processor configured to perform:

providing at least a line on said printed circuit board, each of said line including two ends and intersecting said geometric layout to form a plurality of points of intersection;

defining line segments by segmenting each of said line at each of said points of intersection to form a plurality of line segments;

deleting some of said line segments having one end not being point of intersection for said geometric layout to form a plurality of segmented regions;

searching closed region by repeatedly searching region formed by any one of the points in said plurality of segmented regions moving toward a neighboring point and returning to said same point;

determining smallest closed region, determining a closed region as smallest closed region when said closed region being found not to contain another closed region;

forming a remaining closed region by deducting said plurality of segmented regions from said edge of printed circuit board, said remaining closed region including closed region formed between said edge of printed circuit board and points of said plurality of segmented regions;

determining whether a via hole is located within said smallest closed region according to sum of directed angles formed by said via hole and points of said smallest closed region; and determining whether another via hole is located within said remaining closed region according to sum of directed angles formed by said other via hole and edge and points of said remaining closed region.

* * * * *